United States Patent
Xie

(10) Patent No.: US 11,148,291 B2
(45) Date of Patent: Oct. 19, 2021

(54) ANTI-COLLISION DETECTION METHOD FOR SWEEPING ROBOTS

(71) Applicant: SHENZHEN UMOUSE TECHNOLOGY CO., LTD., Shenzhen (CN)

(72) Inventor: Tao Xie, Shenzhen (CN)

(73) Assignee: SHENZHEN UMOUSE TECHNOLOGY CO., LTD., Shenzhen (CN)

(*) Notice: Subject to any disclaimer, the term of this patent is extended or adjusted under 35 U.S.C. 154(b) by 112 days.

(21) Appl. No.: 16/726,172

(22) Filed: Dec. 23, 2019

(65) Prior Publication Data

US 2020/0130185 A1 Apr. 30, 2020

Related U.S. Application Data

(63) Continuation of application No. PCT/CN2019/077546, filed on Mar. 8, 2019.

(30) Foreign Application Priority Data

Aug. 22, 2018 (CN) .................... 201810958877.X

(51) Int. Cl.
*B81B 7/02* (2006.01)
*B25J 9/16* (2006.01)
(Continued)

(52) U.S. Cl.
CPC .............. *B25J 9/1666* (2013.01); *A47L 11/24* (2013.01); *A47L 11/4061* (2013.01);
(Continued)

(58) Field of Classification Search
CPC .... G05D 1/0246; G05D 1/027; G05D 1/0214; G05D 1/0274; G05D 2201/0203; G05D 1/0238; G05D 1/0088; G05D 2201/0215; G05D 1/0212; G05D 2201/0208; G06T 2207/30244; G06T 2207/10028; G06T 2207/10016; G06T 2207/30248; G06T 2207/30261; G06K 9/00664;
(Continued)

(56) References Cited

U.S. PATENT DOCUMENTS 10,390,003 B1 * 8/2019 Liu ..................... G06T 7/246
10,395,117 B1 * 8/2019 Zhang ................ G01C 21/206
(Continued)

OTHER PUBLICATIONS

Know et al., Sensor data fusion using fuzzy control for VOR-based vision tracking system, 2010, IEEE, p. 2920-2925 (Year: 2010).*
(Continued)

*Primary Examiner* — Mcdieunel Marc

(57) ABSTRACT

An anti-collision detection method for sweeping robots, which includes following steps. Step 1: preparing a sweeping robot provided with a Micro-Electro-Mechanical System (MEMS) device comprising an accelerometer and a gyroscope; skipping to step 2 when the sweeping robot is in a linear motion state and collides with an object; skipping to step 3 when the sweeping robot is on an external bumpy road; and skipping to step 4 when the sweeping robot is in a rotating motion state and blocked by an obstacle.

6 Claims, 1 Drawing Sheet

(51) Int. Cl.
*A47L 11/24* (2006.01)
*A47L 11/40* (2006.01)
*B25J 9/00* (2006.01)
*G05D 1/02* (2020.01)

(52) U.S. Cl.
CPC ............... *B25J 9/0003* (2013.01); *B81B 7/02* (2013.01); *G05D 1/0214* (2013.01); *B81B 2201/0235* (2013.01); *B81B 2201/0242* (2013.01); *G05D 2201/0215* (2013.01)

(58) Field of Classification Search
CPC ... G06K 9/00805; G06K 9/209; B25J 9/1676; B25J 9/1697; B25J 9/0003; B25J 9/1666; B25J 19/02; B25J 9/16; A47L 11/4061; A47L 11/24; A47L 11/4011; G01P 15/18; G01P 1/127; B81B 2201/0235; B81B 2201/0242; B81B 7/02; G01S 13/931; G01S 2007/4975; G01S 2013/9315; G01S 2013/9316; G01S 2013/9319; G01S 13/867; G01S 17/931; G01C 21/12; G01C 11/025; B60N 2/2863
See application file for complete search history.

(56) References Cited

U.S. PATENT DOCUMENTS

| | | | |
|---|---|---|---|
| 10,496,104 B1* | 12/2019 | Liu | G01S 5/16 |
| 10,571,925 B1* | 2/2020 | Zhang | G05D 1/0246 |
| 10,571,926 B1* | 2/2020 | Zhang | G05D 1/0219 |
| 10,769,440 B1* | 9/2020 | Zhang | G06K 9/4604 |
| 2018/0364731 A1* | 12/2018 | Liu | G06T 7/74 |
| 2021/0116909 A1* | 4/2021 | Tang | A47L 11/4011 |

OTHER PUBLICATIONS

Lee et al., Position estimation for mobile robot using in-plane 3-axis IMU and active beacon, 2009, IEEE, p. 1956-1961 (Year: 2009).*

Wei et al., A new MEMS Gyro north finding approach using LSM for mobile robot heading detection, 2012, IEEE, p. 2262-2267 (Year: 2012).*

Kowalczuk et al., Evaluation of position estimation based on accelerometer data, 2015, IEEE, pg. (Year: 2015).*

* cited by examiner

ANTI-COLLISION DETECTION METHOD FOR SWEEPING ROBOTS

TECHNICAL FIELD

The present disclosure relates to a technical filed of sweeping robot products, in particular to an anti-collision detection method for sweeping robots, which is reasonable in structural design, good in using effect, and high in detection accuracy.

BACKGROUND

In recent years, products of sweeping robots are rapidly popularized and applied, and are greatly improved in terms of structural aspects and specific functions. Due to a fact that the sweeping robots automatically clean and collect indoor sundries and have certain intelligent level, a use prospect of the sweeping robots is very prominent.

Currently, a quantity of the sweeping robots generally sense an external state by adopting a collision sensor and perform corresponding feedback to take corresponding measures according to the sensed collision condition. However, present technology exists many defects, such as insufficient sensing precision, single structural design, insufficient function and so on, which restricts further popularization of the products. Based on above, those skilled in the art carried out a lot of research, developments, and experiments, and improved the products from a specific anti-collision detection method part, which obtains good performance.

SUMMARY

In order to overcome problems existed in the prior art, the present disclosure provides an anti-collision detection method for sweeping robots, which is reasonable in structural design, good in using effect, and high in detection accuracy.

Comparing with the prior art, the present disclosure provides an anti-collision detection method for sweeping robots. In different application scenes, such as when the sweeping robot walks straightly and collides with external obstacles, the sweeping robot rotates and collides with external obstacles, or the sweeping robot walks on the bumpy road, the sweeping robot provided with a Micro-Electro-Mechanical System (MEMS) device detects and adjusts collisions by utilizing different correction modes, so that the sweeping robot normally and stably runs. The present disclosure is reasonable in structural design and outstanding in technical effect.

BRIEF DESCRIPTION OF DRAWINGS

The FIGURE is a schematic flow diagram of an anti-collision detection method for sweeping robots of the present disclosure.

DETAILED DESCRIPTION

In order to make objectives, technical solutions and advantages of the present disclosure more comprehensible, the present disclosure is further described in further detail with reference to the accompany drawings and embodiments. It should be understood that the specific embodiments described herein are merely illustrative of the present disclosure and are not intended to limit the present disclosure.

As shown in the FIGURE, the present disclosure provides an anti-collision detection method for sweeping robots, including following steps:

Step 1: preparing a sweeping robot provided with a Micro-Electro-Mechanical System (MEMS) device including an accelerometer and a gyroscope; skipping to step 2 when the sweeping robot is in a linear motion state and collides with an object; skipping to step 3 when the sweeping robot is in a bumpy road condition; and skipping to step 4 when the sweeping robot is in a rotating motion state and blocked by an obstacle.

Step 2: utilizing a Newton second law V=a×t, the V represents velocity, the a represents acceleration, and the t represents time; when the sweeping robot starts walking, an acceleration of the sweeping robot is a positive acceleration; when the sweeping robot collides with an object, the acceleration of the sweeping robot is a negative acceleration; acceleration of a uniform motion is zero; when a collision occurs, correcting the horizontal acceleration numerical value of the sweeping robot by the gyroscope.

The velocity of a moving object is equal to the acceleration multiplies the time. Whether the sweeping robot collides is detected by detecting changes of data obtained by the accelerometer. When the sweeping robot starts walking, the acceleration of the sweeping robot is the positive acceleration. When the sweeping robot collides with the object, the acceleration of the sweeping robot is the negative acceleration. When the sweeping robot moves at a constant speed, the acceleration of the sweeping robot is zero.

Step 3: fusing data by the accelerometer and the gyroscope to obtain an euler angle a and re-distributing the horizontal acceleration by utilizing an inclination angle of the euler angle a; Accy=acczInit*sin(a); and calculating an actual acceleration by utilizing a six-axis fusion calculation method.

Step 4: detecting an angular velocity W by the gyroscope; calculating an angular velocity W1 of a grating by utilizing a grating milemeter of a left wheel and a right wheel, when the sweeping robot is blocked by the obstacle, numerical values of W and W1 are not matched; when the sweeping robot rotates at a certain angle velocity, detecting a tangential acceleration and a normal acceleration of the sweeping robot by the accelerometer; when the collision occurs, the acceleration of the sweeping robot is changed, such that an abnormal tangential acceleration and normal acceleration are obtained; re-distributing the angular velocity and the acceleration by fusing data.

Step 5: completing a collision detection for the sweeping robot.

The present disclosure provides the anti-collision detection method for sweeping robots. In different application scenes, such as when the sweeping robot walks straightly and collides with external obstacles, the sweeping robot rotates and collides with external obstacles, or the sweeping robot walks on the bumpy road, the sweeping robot provided with a Micro-Electro-Mechanical System (MEMS) device detects and adjusts collisions by utilizing different correction modes, so that the sweeping robot normally and stably runs. The present disclosure is reasonable in structural design and outstanding in technical effect.

Furthermore, in the step 2, the step 3, and the step 4, the present disclosure senses and collects the data by synchronously utilizing the grating milemeter, driving wheel current detection, infrared sensor sensing obstacle conditions, and a universal wheel sensor to perform an auxiliary treatment on an acceleration collision. The grating milemeter (M) measures a velocity, determines whether the velocity is uniform or accelerated, and then corrects the velocity. The corrected velocity Vi=V0+a*t. The driving wheel current (C) is used as follows: when the sweeping robot walks with a uniform velocity, current is in an approximate constant value, obtaining a specific disturbance value by utilizing a detection of the driving wheel current when the current is disturbed after collision. The infrared sensor (IR) senses whether an obstacle exists in front of the sweeping robot in advance, informs the sweeping robot there is a collision in front, and senses a distance between the obstacle and the sweeping robot. The universal wheel sensor (U) is used as follow: when the sweeping robot is blocked, data of a universal wheel is zero, then the data of the universal wheel is sensed by utilizing the universal wheel sensor. And then the formula: OUT=P0*M+P1*C+P2*IR+P3*U is used to obtain final corrected data, the P0, P1, P2, and P3 are weights.

Furthermore, in the step 2, step 3, and step 4, the present disclosure simultaneously fuses the data by adopting an artificial neural network method to make the sweeping robot autonomously learn and identify the collision.

Furthermore, in the Step 3, the present disclosure obtains data of actual acceleration in 500 ms, performs standard deviation analysis on the data, identifies condition of a bumpy road surface, and automatically identifies size of collision strength.

Furthermore, the present disclosure decomposes the acceleration by utilizing an orthogonal decomposition mode when the sweeping robot is in a slope operation state.

Furthermore, the present disclosure performs comprehensive analysis on the data obtained by the grating milemeter, the driving wheel current, the infrared sensor, and the universal wheel sensor. And then the present disclosure performs multi-sensor fusion calculation by adapting weighted averaging method.

The sweeping robot obtains data of other sensors in a process of normal cleaning. The grating milemeter, the driving wheel current, the infrared sensor, and the universal wheel sensor are configured to assist in processing acceleration collision.

The grating milemeter: measuring a velocity, determining whether the velocity is uniform or accelerated, and then correcting the velocity, the corrected velocity Vi=V0+a*t.

The driving wheel current: when the sweeping robot walks with a uniform velocity, current is in an approximate constant value.

The infrared sensor: sensing whether an obstacle exists in front of the sweeping robot in advance, informing the sweeping robot there is a collision in front.

Comparing with the prior art, the present disclosure provides the anti-collision detection method for sweeping robots. In different application scenes, such as when the sweeping robot walks straightly and collides with the external obstacles, the sweeping robot rotates and collides with the external obstacles, or the sweeping robot walks on the bumpy road, the sweeping robot provided with the MEMS device detects and adjusts the collisions by utilizing different correction modes, so that the sweeping robot normally and stably runs. The present disclosure is reasonable in the structural design and outstanding in the technical effect.

The embodiments of the present disclosure do not limit the protection scope of the present disclosure. Any modification, equivalent replacement and improvement made within the spirit and principle of the present disclosure should be included within the protection scope of the claims of the present disclosure.

What is claimed is:

1. An anti-collision detection method for sweeping robots, comprising following steps:
    step 1: preparing a sweeping robot provided with a Micro-Electro-Mechanical System (MEMS) device comprising an accelerometer and a gyroscope; skipping to step 2 when the sweeping robot is in a linear motion state and collides with an object; skipping to step 3 when the sweeping robot is on an external bumpy road; skipping to step 4 when the sweeping robot is in a rotating motion state and blocked by an obstacle,
    step 2: utilizing a Newton second law V=a×t, wherein the V represents velocity, the a represents acceleration, and the t represents time; when the sweeping robot starts walking, an acceleration of the sweeping robot is a positive acceleration; when the sweeping robot collides with the object, the acceleration of the sweeping robot is a negative acceleration; when the sweeping robot moves at a constant speed, the acceleration of the sweeping robot is zero; when a collision occurs, correcting the horizontal acceleration numerical value of the sweeping robot by the gyroscope;
    step 3: fusing data by the accelerometer and the gyroscope to obtain an euler angle a, and re-distributing the horizontal acceleration by utilizing an inclination angle of the euler angle a; Accy=acczInit*sin(a); and calculating an actual acceleration by utilizing a six-axis fusion calculation method,
    step 4: detecting an angular velocity W by the gyroscope; calculating an angular velocity W1 of a grating by utilizing a grating milemeter of a left wheel and a right wheel, when the sweeping robot is blocked by the obstacle, numerical values of W and W1 are not matched; when the sweeping robot rotates at a certain angle velocity, detecting a tangential acceleration and a normal acceleration of the sweeping robot by the accelerometer; when the collision occurs, the acceleration of the sweeping robot is changed, such that an abnormal tangential acceleration and an abnormal normal acceleration are obtained; re-distributing the angular velocity and the acceleration by fusing data; and
    step 6: completing a collision detection for the sweeping robot.

2. The anti-collision detection method for sweeping robots according to claim 1, wherein in the step 2, the step 3, and the step 4, detecting obstacle conditions by the grating milemeter and driving wheel current, sensing obstacle conditions by infrared sensor, and sensing and collecting the data by a universal wheel sensor synchronously to perform an auxiliary treatment on an acceleration collision; wherein the grating milemeter (M): measuring a velocity, determining whether the velocity is uniform or accelerated, and then correcting the velocity, the corrected velocity Vi=V0+a*t; the driving wheel current (C): when the sweeping robot walks with the constant speed, current is in an approximate constant value, obtaining a specific disturbance value by utilizing a detection of the driving wheel current when the current is disturbed after collision; the infrared sensor (IR): sensing whether an obstacle exists in front of the sweeping robot in advance, informing the sweeping robot a collision would occurred in front, and sensing a distance between the obstacle and the sweeping robot by utilizing the infrared sensor; the universal wheel sensor (U): when the sweeping robot is blocked, data of an universal wheel is zero, then sensing data of a universal wheel by utilizing the universal wheel sensor; and then utilizing the formula: OUT=P0*M+ P1*C+P2*IR+P3*U to obtain final corrected data, wherein the P0, P1, P2, and P3 are weights.

3. The anti-collision detection method for sweeping robots according to claim 2, wherein in the step 2, step 3, and step 4, simultaneously fusing the data by adopting an artificial neural network method to make the sweeping robot autonomously learn and identify the collision.

4. The anti-collision detection method for sweeping robots according to claim 1, wherein in the step 3, obtaining data of the actual acceleration in 500 ms, performing standard deviation analysis on the data, identifying condition of a bumpy road surface, and automatically identifying size of collision strength.

5. The anti-collision detection method for sweeping robots according to claim 1, further comprises: decomposing the acceleration by utilizing an orthogonal decomposition mode when the sweeping robot is in a slope operation state.

6. The anti-collision detection method for sweeping robots according to claim 2, performing comprehensive analysis on the data obtained by the grating milemeter, the driving wheel current, the infrared sensor, and the universal wheel sensor; and then performing multi-sensor fusion calculation by adapting weighted averaging method.

* * * * *